(12) United States Patent
Okumura et al.

(10) Patent No.: US 9,136,378 B2
(45) Date of Patent: Sep. 15, 2015

(54) SEMICONDUCTOR DEVICE AND MANUFACTURING METHOD FOR SAME

(75) Inventors: Keiji Okumura, Kyoto (JP); Mineo Miura, Kyoto (JP); Katsuhisa Nagao, Kyoto (JP); Shuhei Mitani, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 13/824,380

(22) PCT Filed: Sep. 15, 2011

(86) PCT No.: PCT/JP2011/071070
§ 371 (c)(1),
(2), (4) Date: Jun. 3, 2013

(87) PCT Pub. No.: WO2012/036229
PCT Pub. Date: Mar. 22, 2012

(65) Prior Publication Data
US 2013/0248981 A1 Sep. 26, 2013

(30) Foreign Application Priority Data
Sep. 17, 2010 (JP) .................................. 2010-209627

(51) Int. Cl.
*H01L 29/66* (2006.01)
*H01L 29/78* (2006.01)
*H01L 29/423* (2006.01)
*H01L 21/04* (2006.01)
*H01L 29/04* (2006.01)
(Continued)

(52) U.S. Cl.
CPC ...... *H01L 29/7827* (2013.01); *H01L 29/42368* (2013.01); *H01L 29/66068* (2013.01); *H01L 29/66666* (2013.01); *H01L 29/7802* (2013.01); *H01L 21/046* (2013.01); *H01L 21/049* (2013.01); *H01L 29/045* (2013.01); *H01L 29/0619* (2013.01); *H01L 29/0696* (2013.01); *H01L 29/1608* (2013.01); *H01L 29/45* (2013.01); *H01L 29/518* (2013.01); *H01L 29/7811* (2013.01)

(58) Field of Classification Search
USPC ............. 257/77, 329, 339, E21.054, E21.065
See application file for complete search history.

(56) References Cited

U.S. PATENT DOCUMENTS 4,466,175 A * 8/1984 Coe ................................ 438/273
5,474,944 A 12/1995 Zambrano
(Continued)

FOREIGN PATENT DOCUMENTS

| JP | 04-116869 | * | 4/1992 |
| JP | 6-302826 A | | 10/1994 |

(Continued)

*Primary Examiner* — Tan N Tran
(74) *Attorney, Agent, or Firm* — Rabin & Berdo, P.C.

(57) ABSTRACT

A semiconductor device includes a first conductive-type semiconductor layer, a second conductive-type body region formed in a surficial portion of the semiconductor layer, a first conductive-type source region formed in a surficial portion of the body region, a gate insulating film provided on the semiconductor layer and containing nitrogen atoms, the gate insulating film including a first portion in contact with the semiconductor layer outside the body region, a second portion in contact with the body region, and a third portion in contact with the source region, and a gate electrode provided on the gate insulating film in an area extending across the semiconductor layer outside the body region, the body region, and the source region. The third portion of the gate insulating film has a thickness greater than the thickness of the first portion and the thickness of the second portion.

16 Claims, 12 Drawing Sheets

(51) Int. Cl.
　　*H01L 29/06*　　(2006.01)
　　*H01L 29/16*　　(2006.01)
　　*H01L 29/45*　　(2006.01)
　　*H01L 29/51*　　(2006.01)

(56) References Cited

U.S. PATENT DOCUMENTS

| | | |
|---|---|---|
| 5,631,177 A | 5/1997 | Zambrano |
| 7,535,025 B2 * | 5/2009 | Tanimoto et al. ............... 257/77 |
| 2002/0102358 A1 | 8/2002 | Das et al. |
| 2003/0107041 A1 | 6/2003 | Tanimoto et al. |
| 2003/0201482 A1 * | 10/2003 | Shimoida et al. ............. 257/302 |
| 2008/0048257 A1 * | 2/2008 | de Fresart et al. ............ 257/341 |
| 2009/0029293 A1 | 1/2009 | Watanabe |
| 2010/0133613 A1 * | 6/2010 | Furuhashi ..................... 257/347 |
| 2010/0308343 A1 * | 12/2010 | Suzuki et al. .................... 257/77 |
| 2011/0312161 A1 * | 12/2011 | Hamano et al. ............... 438/478 |

FOREIGN PATENT DOCUMENTS

| | | | |
|---|---|---|---|
| JP | 7-240409 A | | 9/1995 |
| JP | 2002-270838 A | | 9/2002 |
| JP | 2003-031808 | * | 1/2003 |
| JP | 2003-031808 A | | 1/2003 |
| JP | 2003-347548 A | | 12/2003 |
| JP | 2004-532522 A | | 10/2004 |
| JP | 2006-216918 A | | 8/2006 |
| JP | 2007-142116 A | | 6/2007 |
| JP | 2008-235448 A | | 10/2008 |
| WO | WO-0229874 A2 | | 4/2002 |
| WO | WO-2007/035304 A1 | | 3/2007 |

* cited by examiner

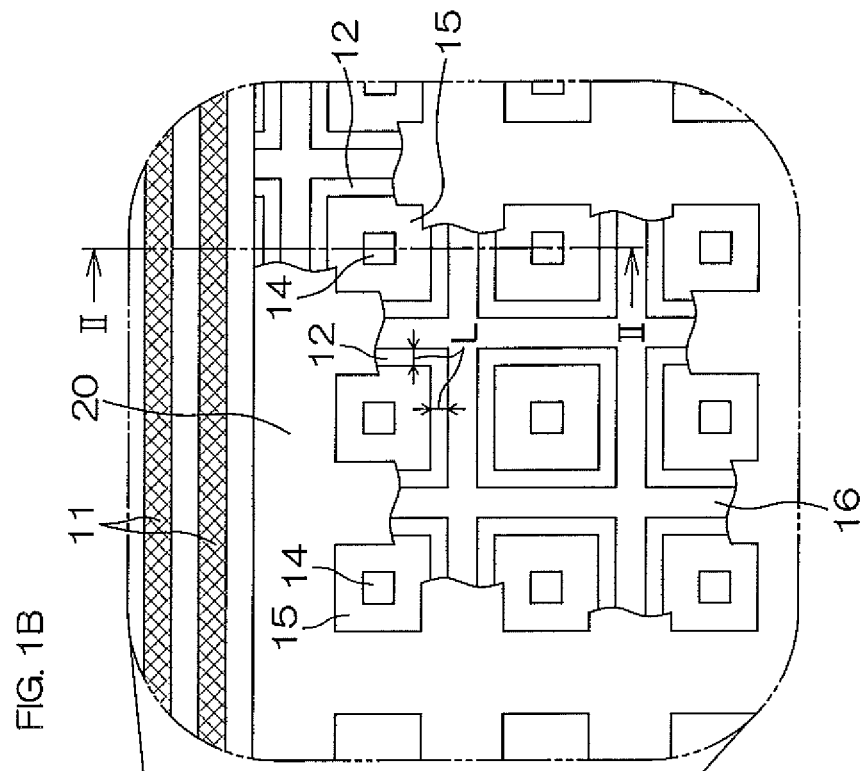
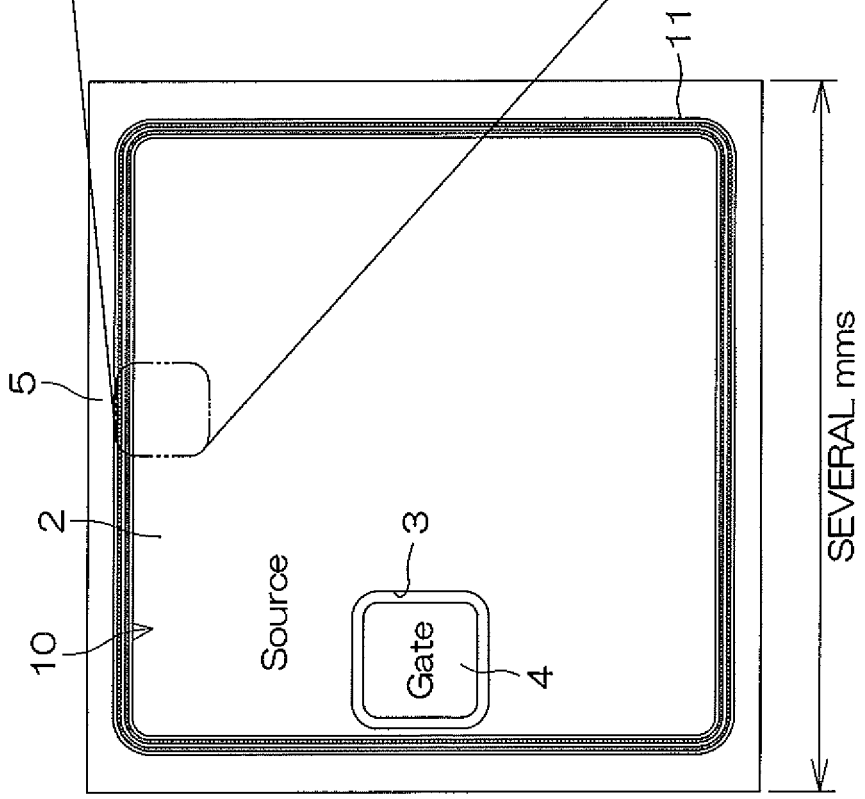
FIG. 1A
FIG. 1B

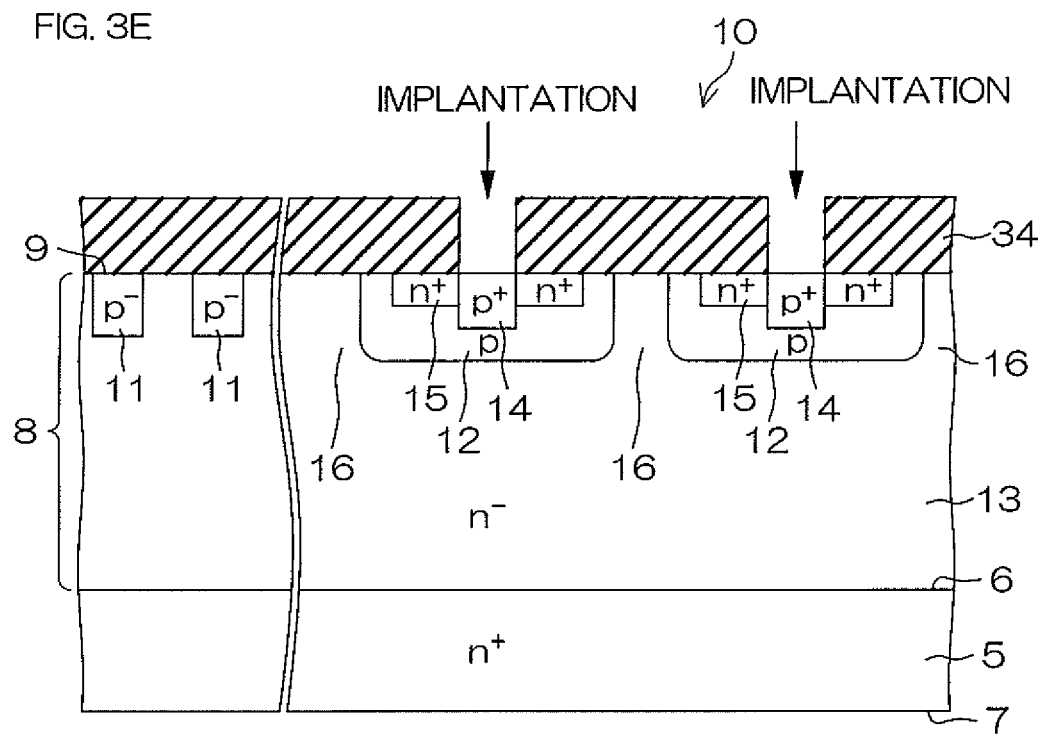
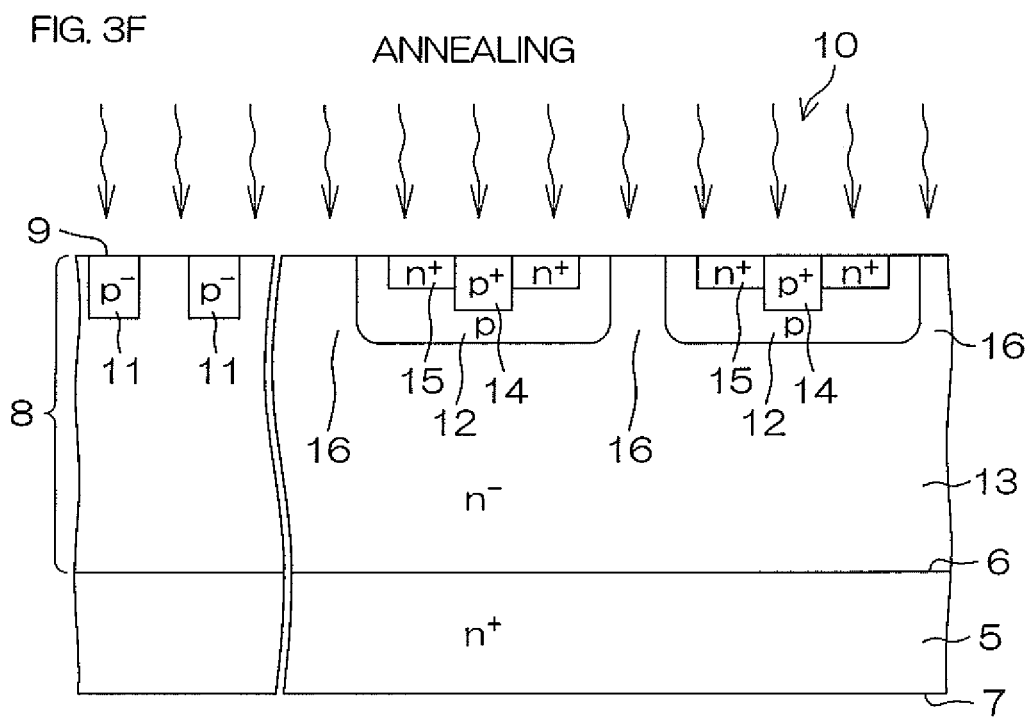

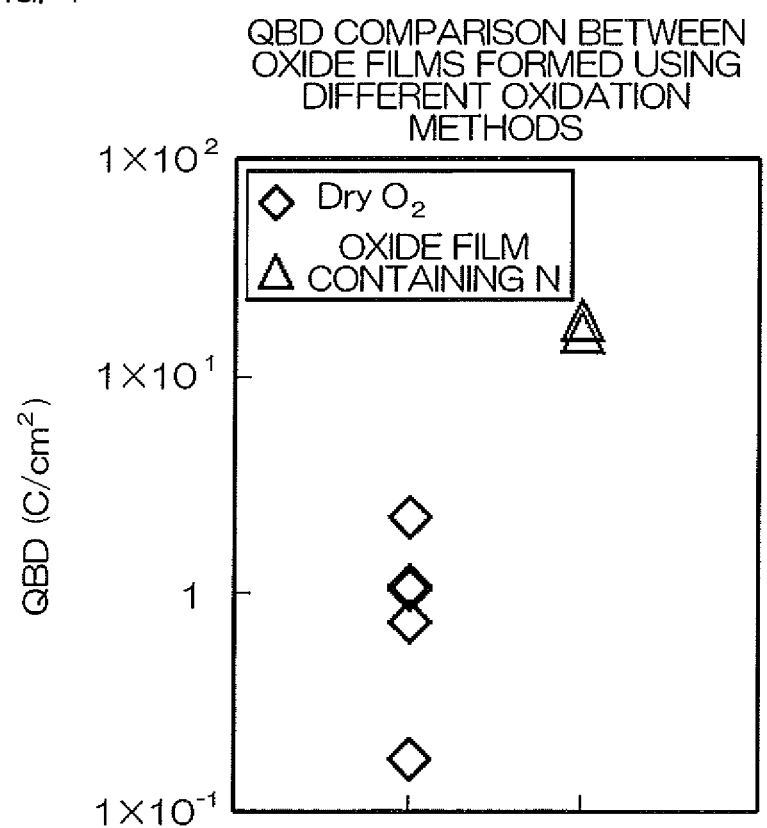

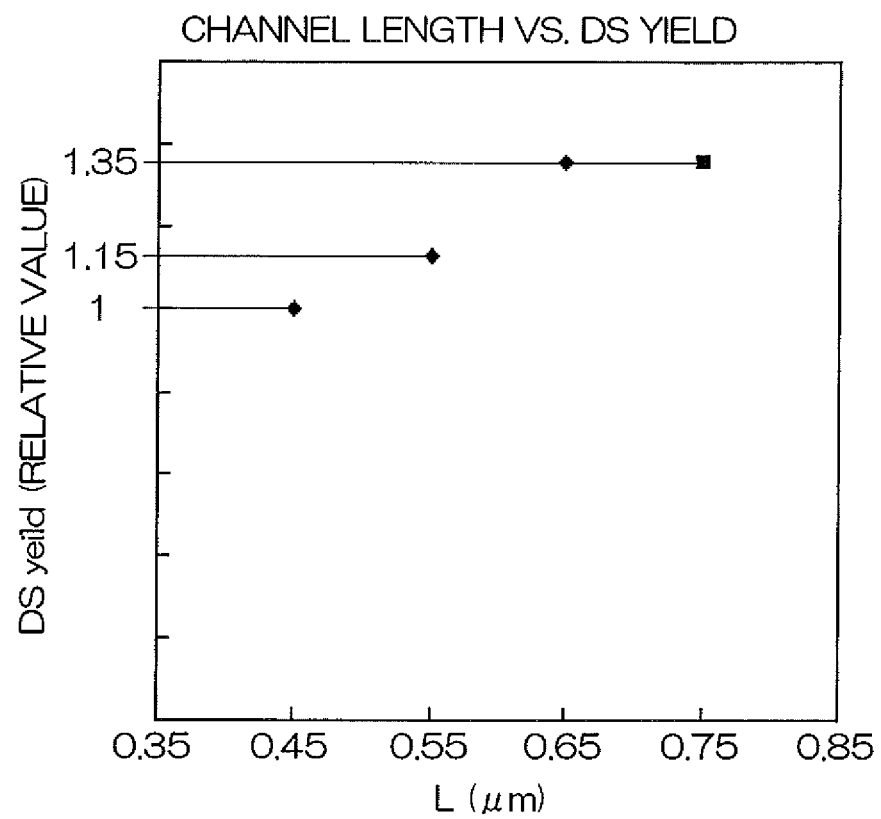

SEMICONDUCTOR DEVICE AND MANUFACTURING METHOD FOR SAME

TECHNICAL FIELD

The present invention relates to a semiconductor device and a method for manufacturing the semiconductor device.

BACKGROUND ART

In the field of power electronics, high-voltage semiconductor devices (power devices) are used to which a high voltage is applied.

There has been known a vertical power device structure in which a large current can be applied easily and further a high-voltage resistance and a low on-resistance can be ensured easily (for example, see Patent Literature 1).

Such a vertical power device includes, for example, an $n^+$ type substrate, an $n^-$ type epitaxial layer laid on the substrate, a p type body region formed in a surficial portion of the epitaxial layer, and an $n^+$ type source region formed in a surficial portion of the body region. A gate insulating film is such that it extends across the surface of the epitaxial layer outside the body region, the surface of the body region, and the surface of the source region. A gate electrode is then formed on the gate insulating film. A source electrode is connected electrically to the source region. A drain electrode is formed on the back surface of the substrate. The vertical power device is thus formed in which the source electrode and the drain electrode are arranged vertically, that is, perpendicularly to the principal surface of the substrate.

When a voltage equal to or higher than a threshold value is applied to the gate electrode while a source-drain voltage is applied between the source electrode and the drain electrode, an electric field on the gate electrode forms a channel in the vicinity of the interface with the gate insulating film in the body region. This causes a current to flow between the source electrode and the drain electrode and thus the power device to turn on.

CITATION LIST

Patent Literature

Patent Literature 1: Japanese Unexamined Patent Publication No. 2003-347548

SUMMARY OF INVENTION

Technical Problem

It is functionally sufficient for the gate electrode and the gate insulating film to face the body region only between the source region and the epitaxial layer. However, the gate electrode and the gate insulating film actually overlap the source region in a plan view. This is mainly caused by the manufacturing process. That is, such an overlap region inevitably exists to reliably make the gate electrode and the gate insulating film face the body region between the source region and the epitaxial layer.

The inventors, however, have found from a detailed research that the gate insulating film has a shorter TDDB (Time-Dependent Dielectric Breakdown) lifetime on the source region than that on the epitaxial layer and the body region. This means that the gate insulating film on the source region puts a limitation on the long-term reliability of the entire gate insulating film, resulting in an obstacle in ensuring reliability of the device.

The present invention hence provides a semiconductor device having a structure in which a gate insulating film can easily ensure long-term reliability and thereby the device itself can easily ensure reliability, and also a method for manufacturing such a semiconductor device.

Solution to Problem

One embodiment of the present invention provides a semiconductor device including: a first conductive-type semiconductor layer, a second conductive-type body region formed in a surficial portion of the semiconductor layer, a first conductive-type source region formed in a surficial portion of the body region, a gate insulating film provided on the semiconductor layer and containing nitrogen atoms, the gate insulating film including a first portion in contact with the semiconductor layer outside the body region, a second portion in contact with the body region, and a third portion in contact with the source region, and a gate electrode provided on the gate insulating film in an area extending across the semiconductor layer outside the body region, the body region, and the source region. The third portion of the gate insulating film has a thickness greater than the thickness of the first portion and the thickness of the second portion.

The aforementioned or other objects, features, and effects of the present invention will be clarified by the following description of embodiments with reference to the accompanying drawings.

BRIEF DESCRIPTION OF DRAWINGS

FIGS. 1A and 1B are schematic plan views of a semiconductor device according to an embodiment of the present invention, where FIG. 1A is an overall view and FIG. 1B is an enlarged view of the internal structure.

FIG. 3BD is a schematic cross-sectional view illustrating the step following that shown in FIG. 3C.

FIG. 4 shows a comparison of QBD (Charge to Breakdown: constant-current TDDB test) between oxide films containing nitrogen and oxide films containing no nitrogen.

FIG. 9 shows a relationship between the channel length and the DS yield (off-characteristics).

DESCRIPTION OF EMBODIMENTS

Figure 2:
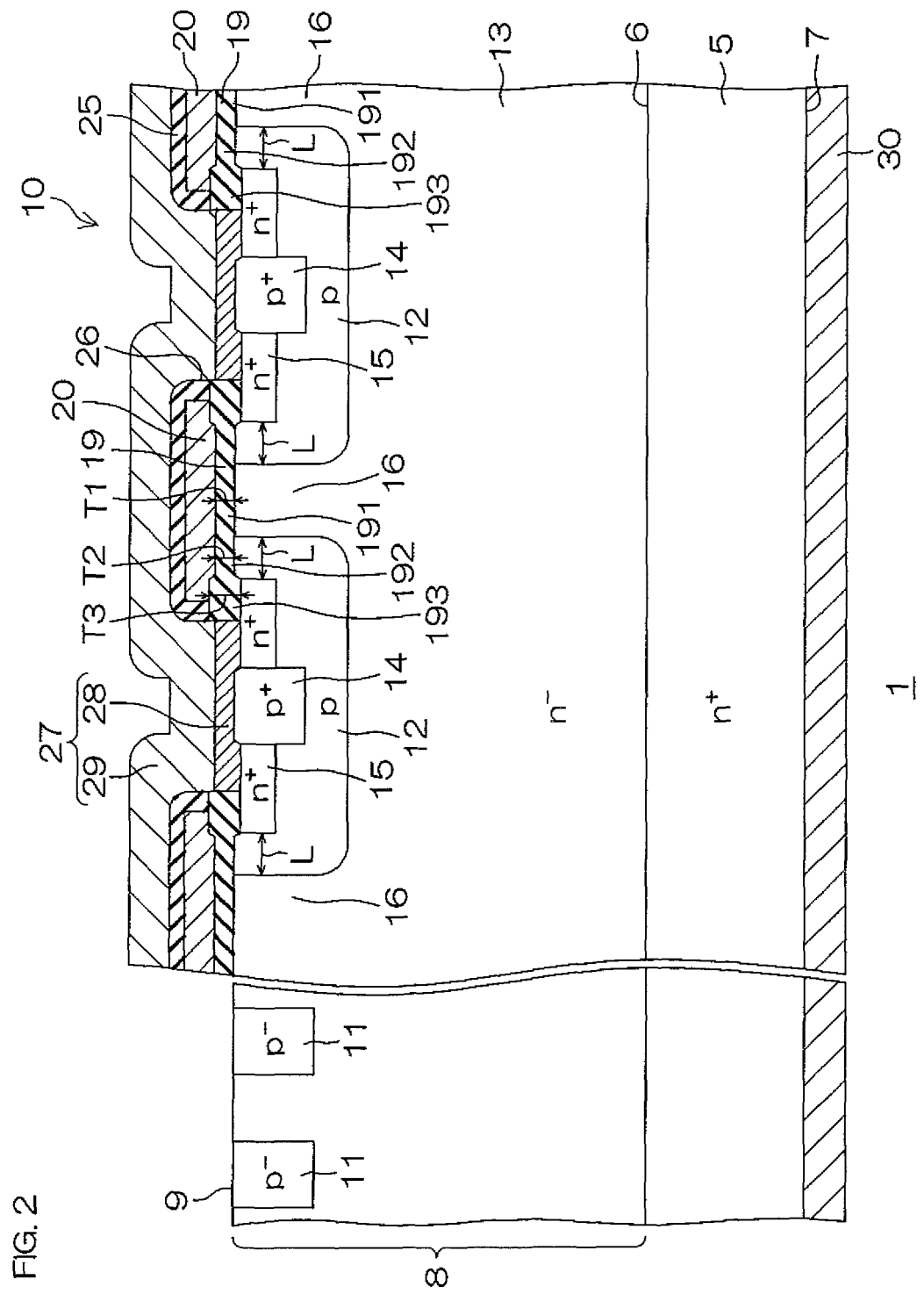
FIG. 2 is a cross-sectional view taken along the section line II-II of FIG. 1B.

One embodiment of the present invention provides a semiconductor device including: a first conductive-type semiconductor layer, a second conductive-type body region formed in a surficial portion of the semiconductor layer, a first conductive-type source region formed in a surficial portion of the body region, a gate insulating film provided on the semiconductor layer and containing nitrogen atoms, the gate insulating film including a first portion in contact with the semiconductor layer outside the body region, a second portion in contact with the body region, and a third portion in contact with the source region, and a gate electrode provided on the gate insulating film in an area extending across the semiconductor layer outside the body region, the body region, and the source region. The third portion of the gate insulating film has a thickness greater than the thickness of the first portion and the thickness of the second portion.

In the semiconductor device, the gate insulating film contains nitrogen atoms. The gate insulating film, if composed of an oxide film, for example, and contains nitrogen atoms at the interface of the oxide film, has a reliability equal to or higher than 5 times that in the case of containing no nitrogen atom. More specifically, the QBD (Charge to Breakdown) increases. Further, in the semiconductor device, the third portion of the gate insulating film in contact with the source region has a thickness greater than the thickness of the first portion in contact with the semiconductor layer (e.g., epitaxial layer) and the second portion in contact with the body region. This allows an electric field, when applied to the gate insulating film, to be reduced in the third portion in contact with the source region, resulting in a reduced leak current in the third portion. This can prevent breakdown in the third portion in contact with the source region, whereby the entire gate insulating film can easily ensure long-term reliability. Accordingly, the entire semiconductor device can easily ensure reliability.

The thickness of the third portion of the gate insulating film is preferably equal to or greater than 2.03 times the thickness of the first portion. This results in that the long-term reliability of the third portion in contact with the source region is equal to or higher than that of the first portion in contact with the semiconductor layer. Thus, the long-term reliability of the third portion in contact with the source region does not put a limitation on the long-term reliability of the entire gate insulating film. The semiconductor layer may contain first conductive-type impurities at a concentration of $5 \times 10^{15}$ cm$^{-3}$ to $1 \times 10^{16}$ cm$^{-3}$, for example.

The thickness of the second portion of the gate insulating film is preferably equal to or greater than 30 nm. If the gate insulating film is composed of, for example, an oxide film containing nitrogen atoms, the second portion having a thickness of 30 nm or more can ensure a voltage resistance or 30 V or higher.

The source region preferably contains first conductive-type impurities at a concentration of $1 \times 10^{19}$ cm$^{-3}$ or higher (more preferably $1 \times 10^{20}$ cm$^{-3}$ or higher). In this case, the semiconductor layer outside the body region and the body region preferably have a first impurity concentration of lower than $1 \times 10^{19}$ cm$^{-3}$ (e.g., $5 \times 10^{15}$ cm$^{-3}$ to $1 \times 10^{18}$ cm$^{-3}$). This allows the third portion in contact with the source region to have a thickness greater than that of the first and second portions in contact, respectively, with the semiconductor layer and the body region if the gate insulating film is composed of a thermally-oxidized film formed by thermally oxidizing the surface of the semiconductor layer, the body region, and the source region. It is therefore possible to easily form a gate insulating film having a selectively thickened third portion.

The semiconductor device preferably further includes an SiC substrate that has a silicon plane having an off-angle of 0 to 10 degrees (more preferably 0 to 5 degrees), and the semiconductor layer is preferably formed on the silicon plane of the SiC substrate. This can easily thicken the oxide film if composed of a thermally-oxidized film formed by thermally oxidizing the surface of the semiconductor layer, the body region, and the source region. If the off-angle is greater than the above range or the semiconductor layer is formed on a carbon plane of an SiC crystal, it is difficult to form a thickened oxide film on the source region. It is noted that the surface of the semiconductor layer, if formed through crystal growth (epitaxial growth) on the silicon plane of the SiC substrate, is also formed of a silicon plane.

The third portion of the gate insulating film preferably has an area smaller than the area of the first portion and the area of the second portion. In this arrangement, since the third portion, which may put a limitation on the long-term reliability, has a smaller area, the entire gate insulating film can easily ensure reliability.

The body region preferably contains second conductive-type impurities at the surface in contact with the gate insulating film at a concentration of $1 \times 10^{17}$ cm$^{-3}$ or lower (more preferably $5 \times 10^{16}$ cm$^{-3}$ or lower). According to this arrangement, if the gate insulating film is composed of an oxide film, the thickness of the third portion on the source region can be greater than that of the second portion on the body region. In addition, since the body region has a relatively low impurity concentration, the device can achieve higher carrier mobility.

The gate electrode preferably protrudes into the source region by 0.2 μm to 1 μm (more preferably 0.4 μm to 0.5 μm) from the boundary between the body region and the source region. This arrangement allows the gate electrode to reliably face the body region, which exists between the source region and the semiconductor layer, whereby it is possible to reliably control the formation of a channel in the body region. Further, since the gate insulating film contains nitrogen atoms and has the thickened portion (third portion) on the source region, it is possible to ensure a sufficient resistance (voltage resistance) against an electric field between the gate electrode and the source region.

The semiconductor device preferably has a channel length of 0.65 μm or more. This results in a reduced off-state leak current and therefore an improved yield.

The gate electrode is preferably applied with a voltage of 6 V or higher. This allows a channel to be formed in the body region just beneath the gate electrode.

The gate electrode is preferably made of polysilicon (more preferably p type polysilicon).

The semiconductor layer is preferably made of SiC. In devices using SiC as a semiconductor material, the reliability (lifetime) of a gate insulating film formed on the surface of an SiC semiconductor layer is inferior to the reliability (lifetime) of a gate insulating film in Si-semiconductor-based devices. This is for the reason that compared to Si, SiC provides a thermally-oxidized film with lower reliability. In addition, since step bunching occurs on the growth surface of an SiC single crystal, an electric field is likely to concentrate locally on the gate insulating film on the SiC semiconductor layer. Applying the present invention to SiC-semiconductor-based devices hence allows the gate insulating film to have a sufficient reliability. It is therefore possible to provide a higher-reliability SiC semiconductor device.

One embodiment of the present invention provides a method for manufacturing a semiconductor device including the steps of forming a second conductive-type body region in a surficial portion of a first conductive-type semiconductor layer, implanting first conductive-type impurity ions into the body region while keeping the semiconductor layer at 150° C. or lower to form a source region containing first conductive-type impurities at a concentration of $1 \times 10^{19}$ cm$^{-3}$ or higher (preferably $1 \times 10^{20}$ cm$^{-3}$ or higher) in a surficial portion of the body region, oxidizing the surface of the semiconductor layer while supplying source gas containing nitrogen oxide gas to the surface of the semiconductor layer to form a gate insulating film containing nitrogen atoms and including a first portion in contact with the semiconductor layer outside the body region, a second portion in contact with the body region, and a third portion in contact with the source region, and forming a gate electrode on the gate insulating film in an area extending across the semiconductor layer outside the body region, the body region, and the source region.

In the method, first conductive-type impurity ions are implanted into the body region while the semiconductor layer is kept at 150° C. or lower (preferably at room temperature) to form a source region having an impurity concentration of $1 \times 10^{19}$ cm$^{-3}$ or higher. This causes a gate insulating film, when formed thereafter by oxidizing the surface of the semiconductor layer, to include a third portion in contact with the source region, having a thickness greater than that of first and second portions in contact, respectively, with the semiconductor layer and the body region. In addition, the gate insulating film, which is formed while nitrogen oxide gas is supplied, contains nitrogen atoms. This improves the reliability (lifetime) of, particularly, the third portion in contact with the source region, whereby it is possible to form a gate insulating film with higher reliability. It is therefore possible to produce a reliable semiconductor device.

The source region preferably has a thickness of 50 nm or more before the oxidizing step. The gate insulating film, which is formed in the oxidizing step, also expands into the source region. The source region having a thickness of 50 nm or more hence allows the first conductive-type source region to remain just beneath the gate insulating film after being formed.

The method preferably further includes the step of epitaxially growing the semiconductor layer on a silicon plane having an off-angle of 0 to 10 degrees (preferably 0 to 5 degrees) of an SiC substrate. This causes the semiconductor layer to have a silicon plane having an off-angle of 0 to 10 degrees (preferably 0 to 5 degrees). Accordingly, the surfaces of the semiconductor layer, the source region, and the body region are all formed of a silicon plane having an off-angle of 0 to 10 degrees (preferably 0 to 5 degrees). This can easily thicken the oxide film if composed of a thermally-oxidized film formed by thermally oxidizing the surface of the semiconductor layer, the body region, and the source region. If the off-angle is greater than the above range or the semiconductor layer is formed on a carbon plane of an SiC crystal, it is difficult to form a thickened oxide film on the source region.

The step of forming the body region preferably includes the step of implanting second conductive-type impurity ions into the semiconductor layer to form the body region containing second conductive-type impurities in the surficial portion thereof at a concentration of $1 \times 10^{17}$ cm$^{-3}$ or lower. This allows the third portion on the source region to have a thickness greater than that of the second portion on the body region through the oxidizing step. In addition, since the body region has a relatively low impurity concentration, the device can achieve higher carrier mobility.

Embodiments of the present invention will hereinafter be described in detail with reference to the accompanying drawings.

FIGS. 1A and 1B are schematic plan views of a semiconductor device according to an embodiment of the present invention, where FIG. 1A is an overall view and FIG. 1B is an enlarged view of the internal structure. FIG. 2 is a cross-sectional view taken along the section line II-II of FIG. 1B.

The semiconductor device 1 is an SiC-based planar-gate VDMOSFET (Vertical Double diffused MOSFET) having a square chip form in a plan view, for example, as shown in FIG. 1A. The chip-formed semiconductor device 1 has vertical and horizontal lengths of about several millimeters, for example, on the plane of FIG. 1A.

A source pad 2 is formed on the surface of the semiconductor device 1. The source pad 2 has an approximately square shape in a plan view with the four corners bent outward and is formed in a manner covering almost the entire surface of the semiconductor device 1. A removal region 3 having an approximately square shape in a plan view is formed near the center of one side of the source pad 2. The source pad 2 is not formed in the removal region 3.

A gate pad 4 is disposed in the removal region 3. The gate pad 4 and the source pad 2 are spaced apart and insulated from each other.

Next will be described the internal structure of the semiconductor device 1.

The semiconductor device 1 includes an n$^+$ type (at a concentration of $1 \times 10^{18}$ cm$^{-3}$ to $1 \times 10^{21}$ cm$^{-3}$, for example) SiC substrate 5. The SiC substrate 5 serves as a drain of the semiconductor device 1 in the present embodiment, with the surface 6 (upper surface) thereof being an Si plane (silicon plane), while the back surface 7 (lower surface) thereof being a C plane (carbon plane). The surface 6 of the SiC substrate 5 is preferably an Si plane having an off-angle of 0 to 10 degrees (more preferably 0 to 5 degrees).

An n$^-$ type (at an n type impurity concentration of $1 \times 10^{15}$ to $1 \times 10^{17}$ cm$^{-3}$, for example) SiC-based epitaxial layer 8 having a lower concentration than that of the SiC substrate 5 is laid on the SiC substrate 5. The epitaxial layer 8, which serves as a semiconductor layer, is formed on the SiC substrate 5 through so-called epitaxial growth. The epitaxial layer 8, which is formed on the Si-plane surface 6, is grown using the Si plane as a growth main face. Accordingly, the surface 9 of the epitaxial layer 8 formed through epitaxial growth is also an Si plane, as is the case with the surface 6 of the SiC substrate 5 and, more specifically, having an off-angle of 0 to 10 degrees (preferably 0 to 5 degrees), as is the case with the SiC substrate 5.

As shown in FIG. 1A, the semiconductor device 1 is formed with an active region 10 disposed in the center on the epitaxial layer 8 in a plan view and serving as a field-effect transistor. Multiple (two in the present embodiment) guard rings 11 (indicated by the double-hatched line in FIGS. 1A and 1B) are formed in the epitaxial layer 8 in a manner surrounding and spaced apart from the active region 10.

The distance between the active region 10 and the guard rings 11 is approximately constant at every circumferential point. The guard rings 11 are p type low-concentration (at a concentration of $1\times10^{13}$ cm$^{-3}$ to $1\times10^{18}$ cm$^{-3}$, for example) regions formed by implanting p type impurities into the epitaxial layer 8.

In the active region 10, many p type body regions 12 are formed in the surface 9 (Si plane) of the epitaxial layer 8 and arranged in a matrix at a constant pitch in the row and column directions. Each one of the body regions 12 has, for example, a square shape in a plan view and has vertical and horizontal lengths of about 7.2 μm, for example, on the plane of FIG. 1B. The body region 12 has a depth of about 0.65 μm, for example. The body region 12 also has a p type impurity concentration of $1\times10^{16}$ cm$^{-3}$ to $1\times10^{17}$ cm$^{-3}$ (equal to or lower than $1\times10^{17}$ cm$^{-3}$), for example. Such a low impurity concentration contributes to the device achieving higher carrier mobility. The p type impurity may be, for example, Al. On the other hand, the area of the epitaxial layer 8 closer to the SiC substrate 5 (C plane) than to the body region 12 remains unchanged after the epitaxial growth to serve as an n$^-$ type drift region 13.

A p$^+$ type body contact region 14 is formed in the center of a surficial portion of each body region 12, and an n$^+$ type source region 15 is formed in a manner surrounding the body contact region 14. The body contact region 14 has a square shape in a plan view and has vertical and horizontal lengths of about 1.6 μm, for example, on the plane of FIG. 1B. The body contact region 14 has a depth of 0.35 μm, for example.

The n$^+$ type source region 15 has an annular square shape in a plan view and has vertical and horizontal lengths of about 5.7 μm, for example, on the paper including FIG. 1B. The source region 15 has a depth of about 0.25 μm, for example. The source region 15 has an n type impurity concentration of $1\times10^{19}$ cm$^{-3}$ or higher, and preferably $1\times10^{20}$ cm$^{-3}$ or higher. More specifically, the concentration may be $1\times10^{19}$ cm$^{-3}$ to $1\times10^{22}$ cm$^{-3}$, and more preferably $1\times10^{20}$ cm$^{-3}$ to $1\times10^{22}$ cm$^{-3}$. The n type impurity may be P (phosphorus).

The region between the body regions 12 (inter-body region 16 sandwiched between side surfaces of adjacent body regions 12), which are arranged in a matrix at a constant pitch in the active region 10, is in a grid form having a constant width (e.g., 2.8 μm).

On the inter-body region 16, a grid-like gate insulating film 19 (not shown in FIG. 1B) is formed along the inter-body region 16. The gate insulating film 19 exists between adjacent body regions 12 and covers a portion of each body region 12 surrounding the source region 15 (a peripheral edge portion of each body region 12) and the outer peripheral edge of each source region 15. In the present embodiment, the gate insulating film 19 is composed of an oxide film containing nitrogen, for example, a nitride-oxide silicon film formed through thermal oxidation using gas containing nitrogen and oxygen.

The gate insulating film 19 includes a first portion 191 in contact with the epitaxial layer 8 outside each body region 12, a second portion 192 in contact with each body region 12, and a third portion 193 in contact with each source region 15. As clearly shown in FIG. 2, the third portion 193 has a thickness T3 greater than the thickness T1 of the first portion 191 and the thickness T2 of the second portion. In more detail, the lower interface (with the source region 15) of the third portion 193 is at a position lower (closer to the SiC substrate 5, that is, at a deeper position from the surface of the epitaxial layer 8) than the lower interface (with the epitaxial layer 8) of the first portion 191 and the lower interface (with the body region 12) of the second portion 192. Also, the upper interface (with the gate electrode 20) of the third portion 193 is at a position higher (closer to the gate electrode 20, that is, at a farther position from the surface of the epitaxial layer 8) than the upper interface (with the gate electrode 20) of the first portion 191 and the upper interface (with the gate electrode 20) of the second portion 192. The thicknesses T1 and T2 of the first and second portions 191 and 192 may be, for example, 30 nm or more (e.g., about 40 nm). Meanwhile, the thickness T3 of the third portion 193 is preferably equal to or greater than 2.03 times the thickness T1 of the first portion 191, for example, and may be about 90 nm.

The gate electrode 20 is formed on the gate insulating film 19. The gate electrode 20 is formed in a grid along the grid-like gate insulating film 19 and faces a peripheral edge portion of each body region 12 with the gate insulating film 19 therebetween. In more detail, the gate electrode 20 faces an area extending across the epitaxial layer 8 outside the body region 12, the body region 12, and the source region 15, with the gate insulating film 19 interposed therebetween. Accordingly, the gate electrode 20 overlaps the source region 15 in a plan view. For example, the gate electrode 20 protrudes onto the source region 15 by 0.2 μm to 1 μm (preferably 0.4 μm to 0.5 μm) from the boundary between the body region 12 and the source region 15. This allows the gate electrode 20 to reliably face the body region 12, which exists between the source region 15 and the epitaxial layer 8, whereby it is possible to reliably control the formation of a channel in the body region 12. The gate electrode 20 is made of, for example, polysilicon, into which p type impurities are introduced at high concentration to achieve lower resistance, for example. The gate electrode 20 has a thickness of about 6000 Å, for example.

In the semiconductor device 1, the boundary between unit cells is set at the center in the width direction of the inter-body region 16. Each unit cell has vertical and horizontal lengths of about 10 μm, for example, on the plane of FIG. 1B. In each unit cell, a controlled voltage (e.g., of 6 V or higher) is applied to the gate electrode 20 to form an annular channel in a peripheral edge portion of the body region 12 in the unit cell. A drain current flowing in the drift region 13 along the four side surfaces of the body region 12 toward the surface 9 of the epitaxial layer 8 can then flow via the annular channel to the source region 15. The channel length L is defined by the width of the body region 12 just beneath the gate electrode 20 and may be 0.65 μm or more (e.g., about 0.8 μm).

On the epitaxial layer 8, an interlayer insulating film 25 made of, for example, SiO$_2$ is laid in a manner covering the gate electrode 20. A contact hole 26 is formed in the interlayer insulating film 25. Within the contact hole 26, the central portion of the source region 15 and the entire body contact region 14 are exposed.

A source electrode 27 is formed on the interlayer insulating film 25. The source electrode 27 is in collective contact with the body contact regions 14 and the source regions 15 of all the unit cells via each contact hole 26. That is, the source electrode 27 serves as a wiring commonly used by all the unit cells. An interlayer insulating film (not shown) is formed on the source electrode 27 and, via the interlayer insulating film (not shown), the source electrode 27 is connected electrically to the source pad 2 (see FIG. 1A). On the other hand, the gate pad 4 (see FIG. 1A) is connected electrically to the gate electrode 20 via a gate wiring (not shown) installed on the interlayer insulating film (not shown).

The source electrode 27 may have a structure in which a Ti/TiN layer 28 and an Al layer 29 are laminated in this order from the side in contact with the epitaxial layer 8. The Ti/TiN layer 28 is a laminated film in which a Ti layer serving as an adhesive layer is provided closer to the epitaxial layer 8 and a TiN layer serving as a barrier layer is laid on the Ti layer. The barrier layer prevents constituent atoms (Al atoms) of the Al layer 29 from diffusing into the epitaxial layer 8.

On the back surface 7 of the SiC substrate 5, a drain electrode 30 is formed in a manner covering the entire surface. The drain electrode 30 is commonly used by all the unit cells. To the drain electrode 30, a laminate structure (Ti/Ni/Au/Ag) in which Ti, Ni, Au, and Ag are laminated, for example, in this order from the side closer to the SiC substrate 5 may be applied.

FIGS. 3A to 3K are schematic cross-sectional views illustrating a method for manufacturing the semiconductor device 1.

Figure 3A:
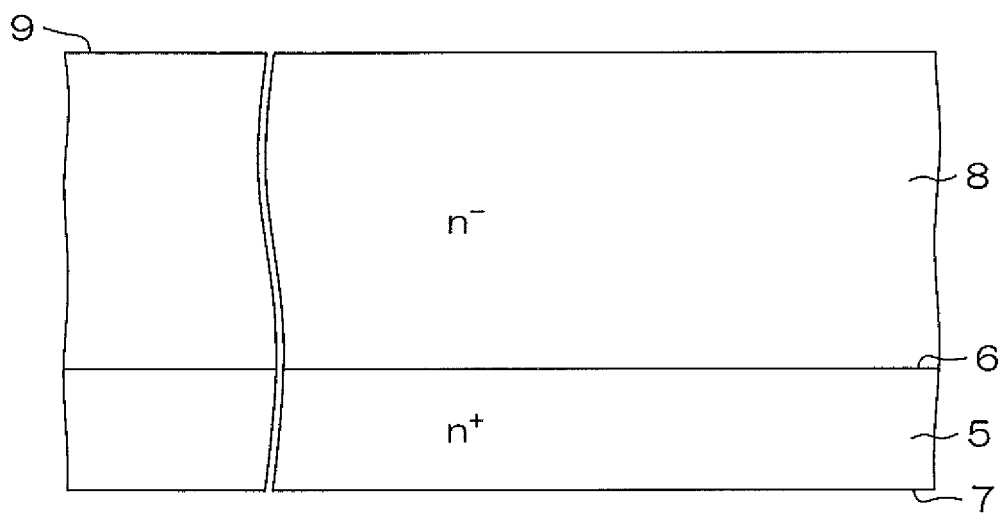
FIG. 3A is a schematic cross-sectional view illustrating a method for manufacturing the semiconductor device.

In the process of manufacturing the semiconductor device 1, as shown in FIG. 3A, an SiC crystal is first grown on the surface 6 (Si plane) of an SiC substrate 5 while n type impurities (e.g., N (nitrogen)) are introduced with an epitaxial growth technique such as CVD (Chemical Vapor Deposition), LPE (Liquid Phase Epitaxy), or MBE (Molecular Beam Epitaxy). An n⁻ type epitaxial layer 8 is thus formed on the SiC substrate 5. The n type impurity concentration is, for example, $1 \times 10^{15}$ cm$^{-3}$ to $1 \times 10^{17}$ cm$^{-3}$.

Figure 3B:
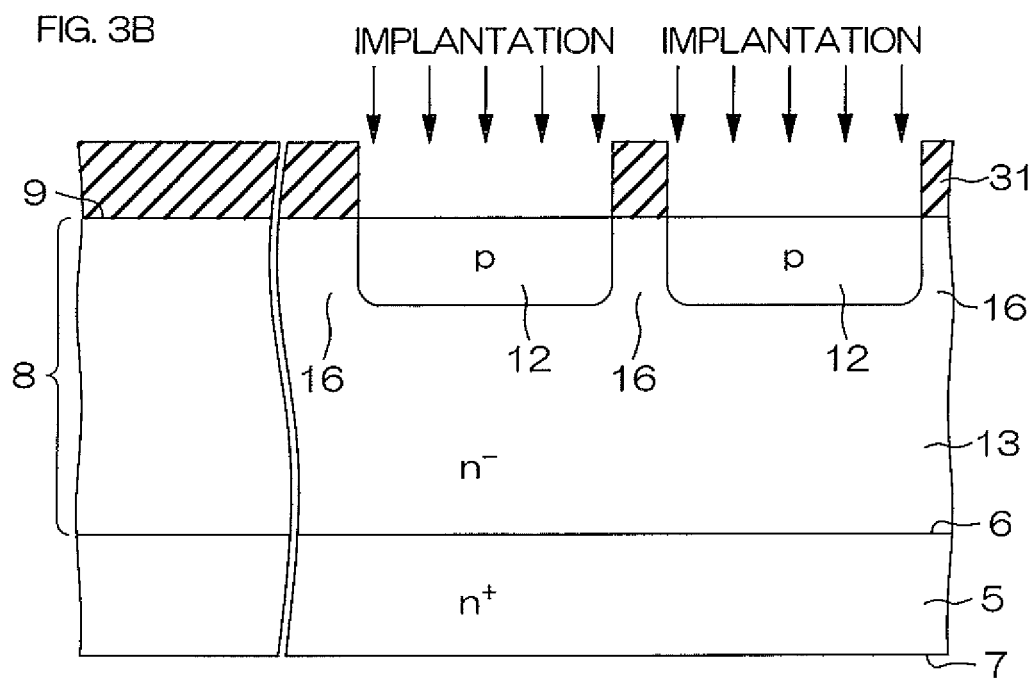
FIG. 3B is a schematic cross-sectional view illustrating the step following that shown in FIG. 3A.

Next, as shown in FIG. 3B, an SiO$_2$ mask 31 having openings through which body regions 12 are to be formed is used to implant p type impurities (e.g., Al (aluminum)) into the epitaxial layer 8 through the surface 9 of the epitaxial layer 8. Conditions of this implantation may include, for example, a dose amount of about $1 \times 10^{13}$ cm$^{-2}$ to $1 \times 10^{14}$ cm$^{-2}$ and an acceleration energy of about 300 keV to 400 keV, although depending on the type of p type impurities. Body regions 12 are thus formed in a surficial portion of the epitaxial layer 8. The body regions 12 have a p type impurity concentration of $1 \times 10^{25}$ cm$^{-3}$ to $1 \times 10^{17}$ cm$^{-3}$ (equal to or lower than $1 \times 10^{17}$ cm$^{-3}$), for example. A base layer portion of the epitaxial layer 8 remains unchanged after the epitaxial growth to form a drift region 13.

Figure 3C:
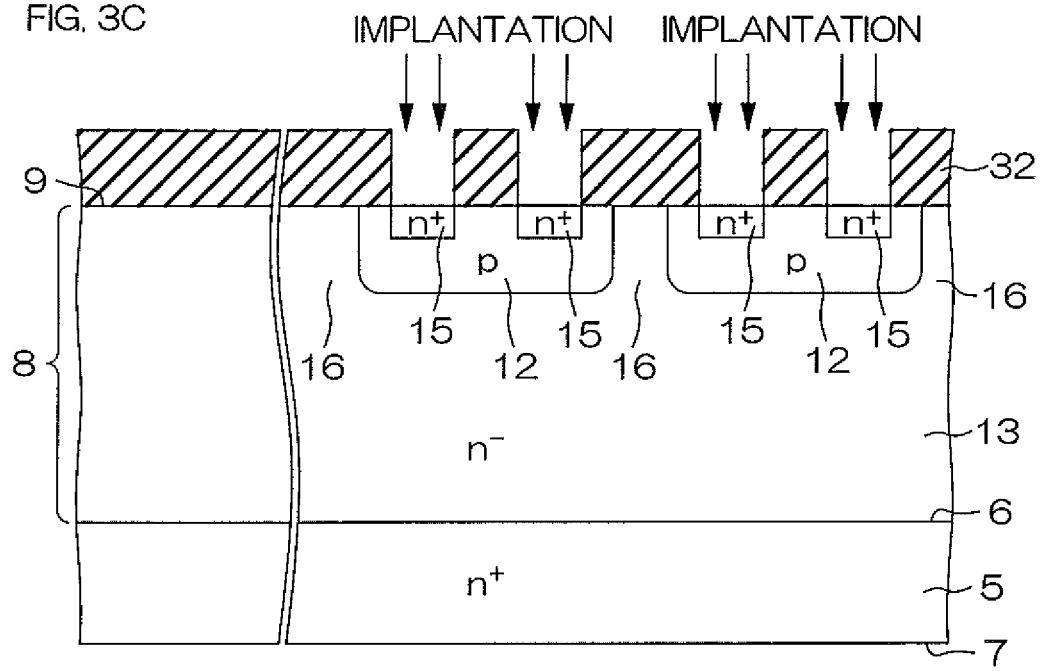
FIG. 3C is a schematic cross-sectional view illustrating the step following that shown in FIG. 3B.

Next, as shown in FIG. 3C, an SiO$_2$ mask 32 having openings through which source regions 15 are to be formed is used to implant n type impurities (e.g., P (phosphorus)) into the epitaxial layer 8 through the surface 9 of the epitaxial layer 8. In this step, the epitaxial layer 8 is kept at a temperature of 150° C. or lower (e.g., at room temperature). More specifically, a multi-stage (e.g., 4-stage) ion implantation may be performed while the epitaxial layer 8 is kept at room temperature at a dose amount of $2.0 \times 10^{13}$ cm$^{-2}$ to $1.0 \times 10^{14}$ cm$^{-2}$ and an acceleration energy of 30 keV to 160 keV, for example, although depending on the type of n type impurities. Source regions 15 are thus formed in a surficial portion of each body region 12. The epitaxial layer 8 is kept at a temperature of 150° C. or lower during the ion implantation so that the source regions 15 cannot crystallize. This allows a thick gate insulating film 19 to be formed on the source regions 15 in a thermal oxidation step (see FIG. 3G) to be described hereinafter. The source regions 15 have an n type impurity concentration of $1 \times 10^{19}$ cm$^{-3}$ to $1 \times 10^{22}$ cm$^{-3}$, for example, and more preferably $1 \times 10^{20}$ cm$^{-3}$ to $1 \times 10^{22}$ cm$^{-3}$.

Figure 3D:
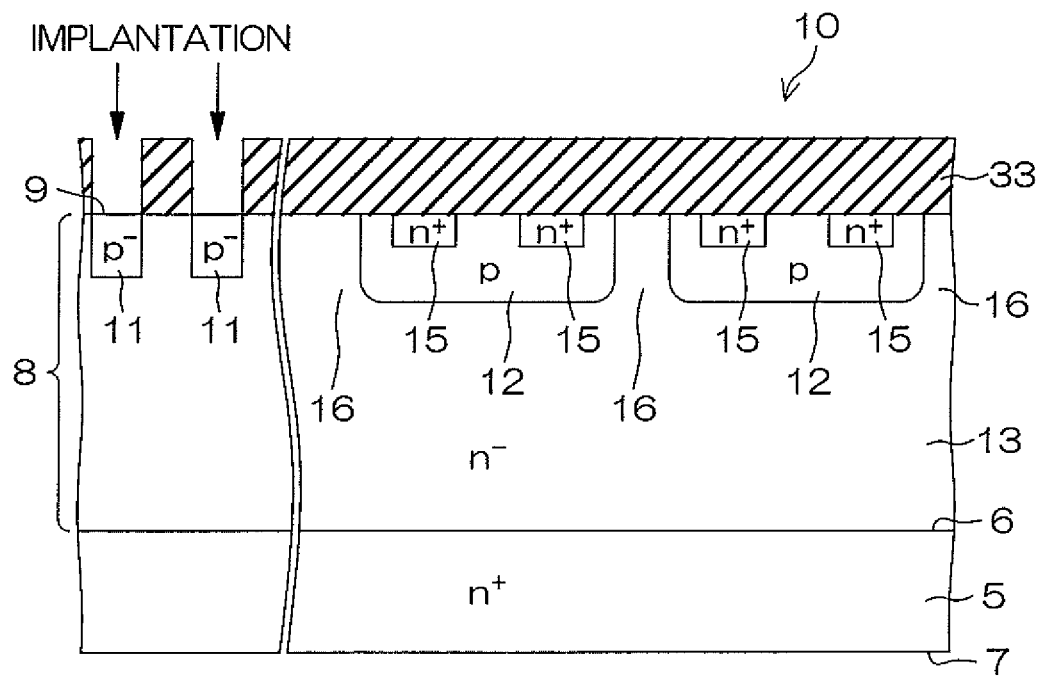
FIG. 3E is a schematic cross-sectional view illustrating the step following that shown in FIG. 3D.
FIG. 3F is a schematic cross-sectional view illustrating the step following that shown in FIG. 3E.
FIG. 3G is a schematic cross-sectional view illustrating the step following that shown in FIG. 3F.
FIG. 3H is a schematic cross-sectional view illustrating the step following that shown in FIG. 3G.
FIG. 3I is a schematic cross-sectional view illustrating the step following that shown in FIG. 3H.
FIG. 3J is a schematic cross-sectional view illustrating the step following that shown in FIG. 3I.
FIG. 3K is a schematic cross-sectional view illustrating the step following that shown in FIG. 3J.

Next, as shown in FIG. 3D, an SiO$_2$ mask 33 having openings through which guard rings 11 are to be formed is used to implant p type impurities (e.g., Al) into the epitaxial layer 8 through the surface 9 of the epitaxial layer 8. More specifically, an ion implantation may be performed at a dose amount of about $1 \times 10^{13}$ cm$^{-2}$ to $1 \times 10^{14}$ cm$^{-2}$ and an acceleration energy of about 380 keV, for example, although depending on the type of p type impurities. Guard rings 11 are thus formed and an active region 10 is defined.

Next, as shown in FIG. 3E, an SiO$_2$ mask 34 having openings through which body contact regions 14 are to be formed is used to implant p type impurities (e.g., Al) into the epitaxial layer 8 through the surface 9 of the epitaxial layer 8. More specifically, a multi-stage (4-stage) implantation may be performed at a dose amount of about $1 \times 10^{15}$ cm$^{-2}$ to $1 \times 10^{16}$ cm$^{-2}$ and an acceleration energy of 30 keV to 180 keV, for example, although depending on the type of p type impurities. Body contact regions 14 are thus formed.

Next, as shown in FIG. 3F, the epitaxial layer 8 undergoes an annealing treatment (heat treatment) for 2 to 10 minutes at 1400 to 2000° C., for example. This causes n type and p type impurity ions implanted in the surficial portion of the epitaxial layer 8 to be activated. The annealing treatment of the epitaxial layer 8 may be performed, for example, in a resistance heating furnace or a high-frequency induction heating furnace at an approximately controlled temperature.

Figure 3G:
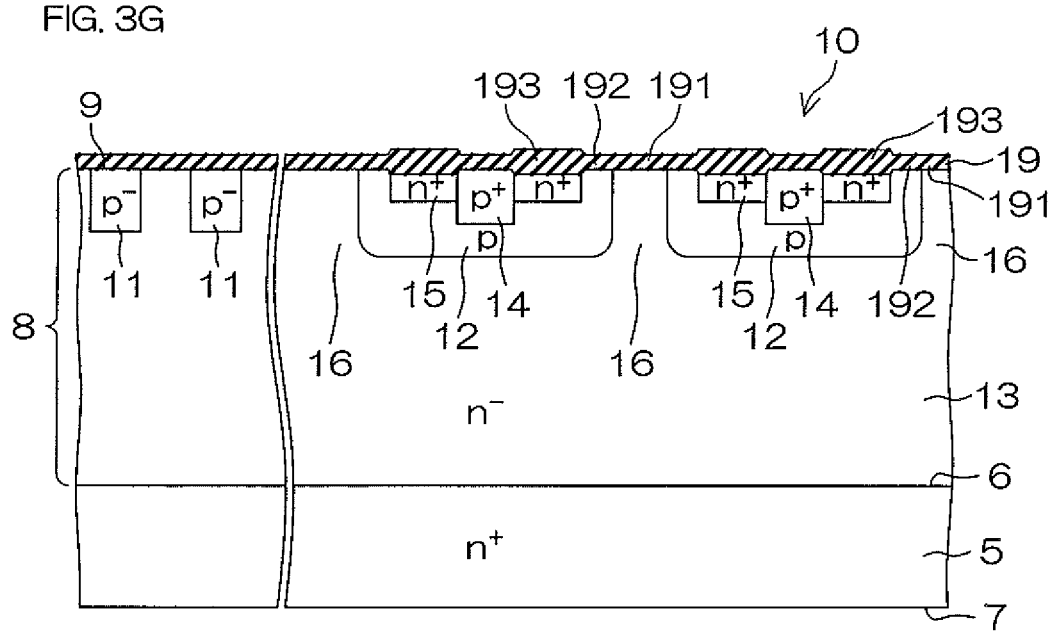

Next, as shown in FIG. 3G, the surface 9 of the epitaxial layer 8 is thermally oxidized to form a gate insulating film 19 covering the entire surface 9. More specifically, a gate insulating film 19 composed of a nitride-oxide silicon film is formed through thermal oxidation (e.g., for 0.5 to 2 days at about 1200° C.) in an atmosphere containing nitrogen and oxygen. As mentioned above, the source regions 15 contain n type impurity ions implanted so as to have a concentration of $1 \times 10^{19}$ cm$^{-3}$ or higher and the ion implantation is performed at a low temperature (150° C. or lower) at which the source regions 15 cannot crystallize. As a result, the gate insulating film 19, formed through thermal oxidation, includes a third portion 191, in contact with each source region 15, having a locally increased thickness T3. Accordingly, the thickness T3 of the third portion 193 is greater than the thickness T1 of the first portion 191 in contact with the epitaxial layer 8 and the thickness T2 of the second portion 192 in contact with each body region 12.

Figure 3H:
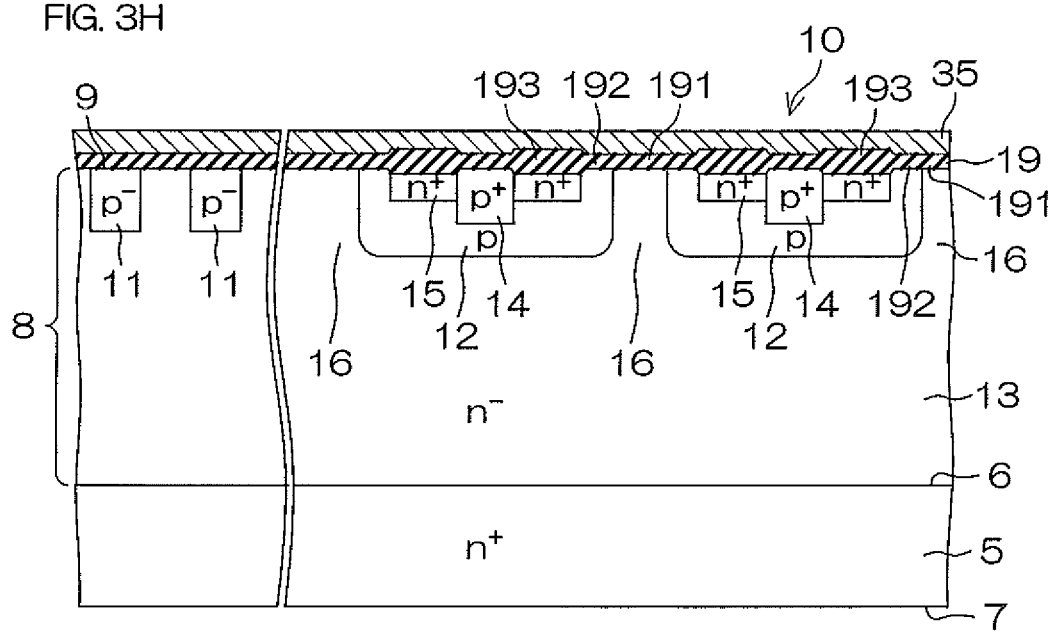
Figure 3:
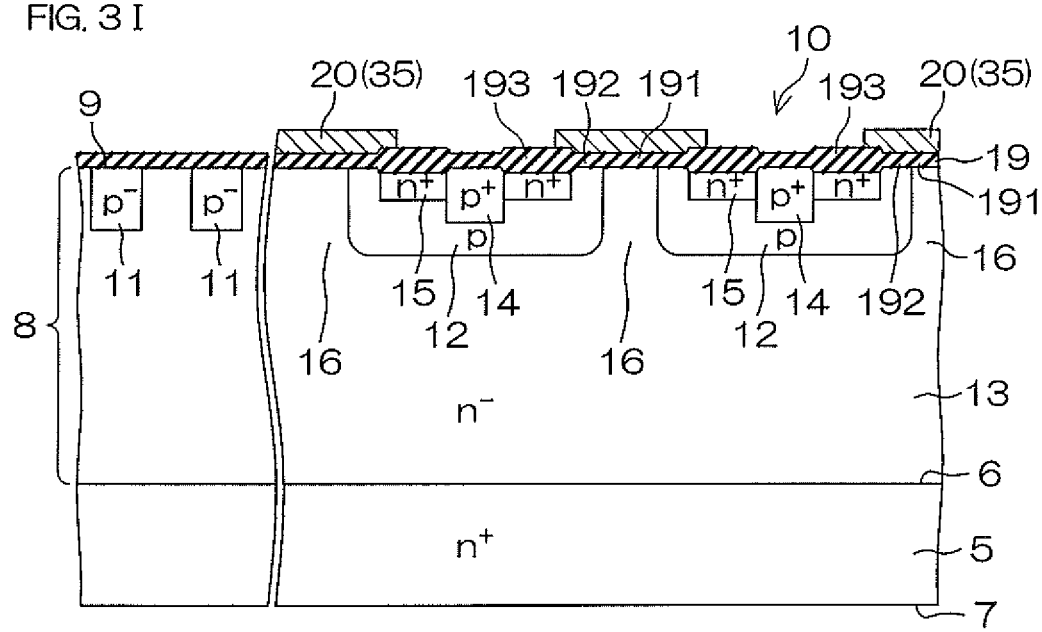
Figure 3:
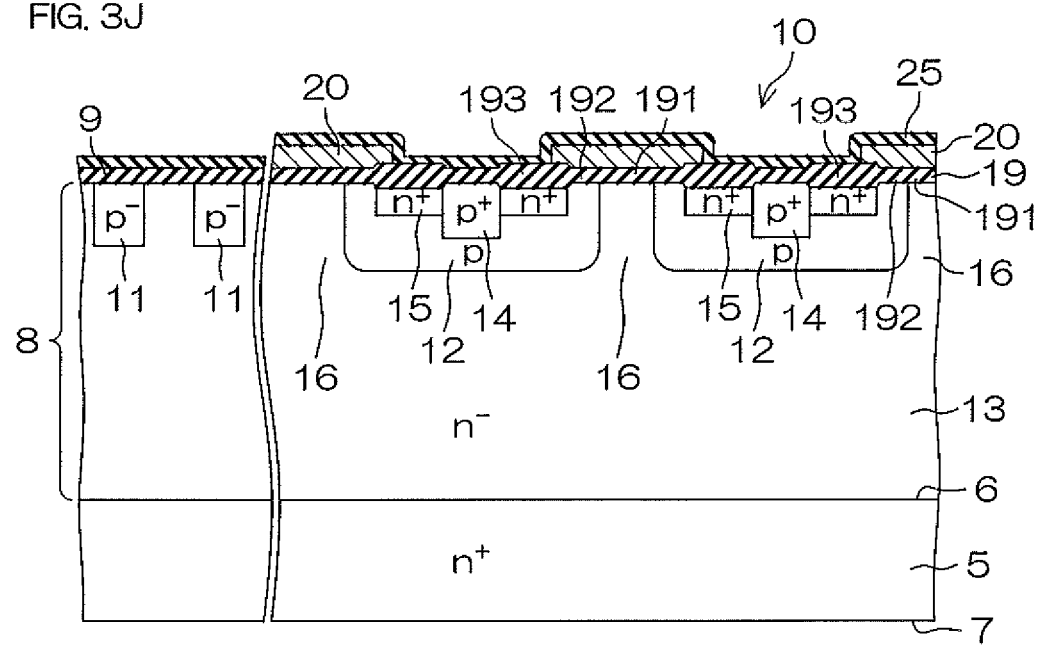

Next, as shown in FIG. 3H, a polysilicon material 35 is deposited on the epitaxial layer 8 using a CVD method while p type impurities (e.g., B (boron)) are introduced. It is to be understood that impurities may be introduced into the polysilicon material 35 through ion implantation.

Thereafter, as shown in FIG. 3I, unnecessary portions (portions not to be a gate electrode 20) of the deposited polysilicon material 35 are removed through dry etching. A gate electrode 20 made of polysilicon is thus formed.

Next, as shown in FIG. 3J, an interlayer insulating film 25 made of SiO$_2$ is laid on the epitaxial layer 8 using a CVD method.

Figure 3K:
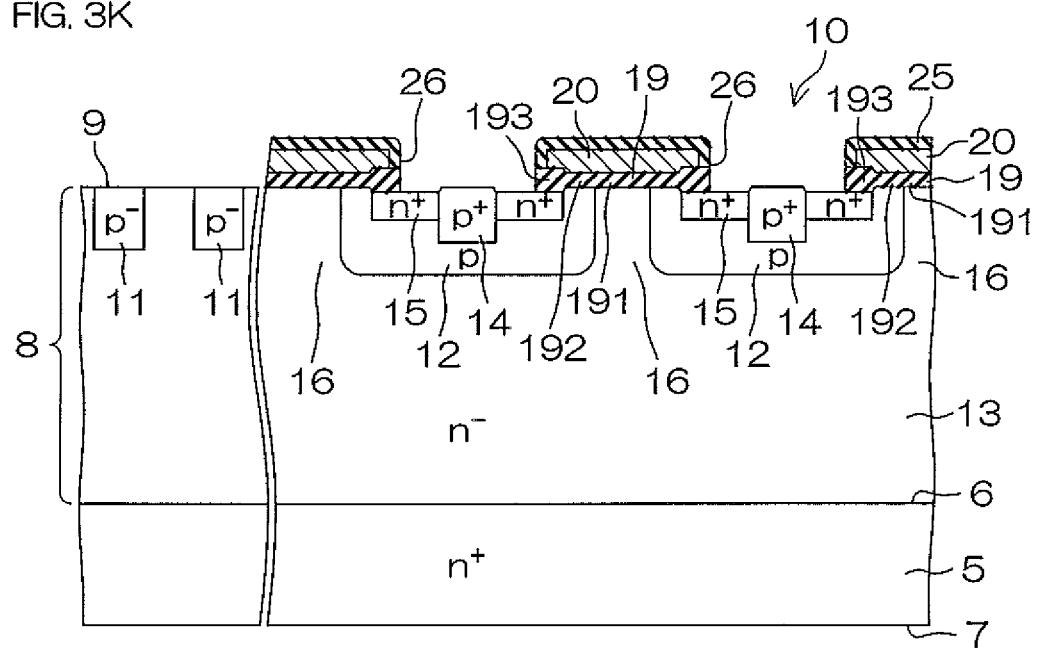

As shown in FIG. 3K, the interlayer insulating film 25 and the gate insulating film 19 are then patterned continuously to form contact holes 26.

Thereafter, Ti, TiN, and Al are, for example, sputtered in this order on the interlayer insulating film 25 to form a source electrode 27. Also, Ti, Ni, Au, and Ag are, for example, sputtered in this order on the back surface 7 of the SiC substrate 5 to form a drain electrode 30.

Following the steps above, an interlayer insulating film (not shown), a source pad 2, and a gate pad 4, etc., are formed to obtain the semiconductor device 1 shown in FIGS. 1A, 1B, and 2.

In the semiconductor device 1, when a drain (source-drain) voltage is applied between the source pad 2 (source electrode 27) and the drain electrode 30 and a predetermined voltage (equal to or higher than a gate threshold voltage, that is, 6 V or higher, for example) is applied to the gate pad 4 (gate electrode 20) with the source pad 2 grounded (i.e. the source electrode 27 is at 0 V), an annular channel is formed in a peripheral edge portion of the body region 12 of each unit cell.

This causes a current to flow from the drain electrode 30 to the source electrode 27 and the unit cell to turn on.

The inventors of the present application have conducted research and found that if the gate insulating film 19 is formed to have a substantially uniform thickness at every point, TDDB (Time-Dependent Dielectric Breakdown) occurs at portions in contact with the source regions 15. Hence, in the gate insulating film 19 of the present embodiment, the thickness T3 of the third portion 193 in contact with each source region 15 is greater than the thicknesses T1 and T2 of the other portions. This allows an electric field to be reduced in the third portion 193, resulting in a reduced leak current and therefore a longer TDDB lifetime. This improves the reliability of the entire gate insulating film 19, which in turn improves the reliability of the semiconductor device 1. Additionally, in the present embodiment, the gate insulating film 19 is composed of a nitride-oxide film and contains nitrogen. As a result, the gate insulating film 19 has an increased voltage resistance and thus gains a higher reliability, which in turn further improves the reliability of the semiconductor device 1.

FIG. 4 shows a comparison of QBD (Charge to Breakdown: constant-current TDDB test) between oxide films containing nitrogen and oxide films containing no nitrogen. The symbols "Δ" indicate QBD measurement results for oxide films containing nitrogen and the symbols "◇" indicate QBD measurement results for oxide films containing no nitrogen. The oxide films containing nitrogen were formed by thermally oxidizing the surface of an SiC crystal in an oxidation gas atmosphere containing N. The oxide films containing no nitrogen were formed by thermally oxidizing the surface of an SiC crystal in a dry oxygen (dry $O_2$) atmosphere. It is found from the measurement results shown in FIG. 4 that the oxide films containing nitrogen show a QBD equal to or higher than 5 times, more specifically, one digit higher than that of the oxide films containing no nitrogen. It is therefore found that the gate insulating film 19, which contains nitrogen, gains a high reliability against breakdown.

Figure 5:
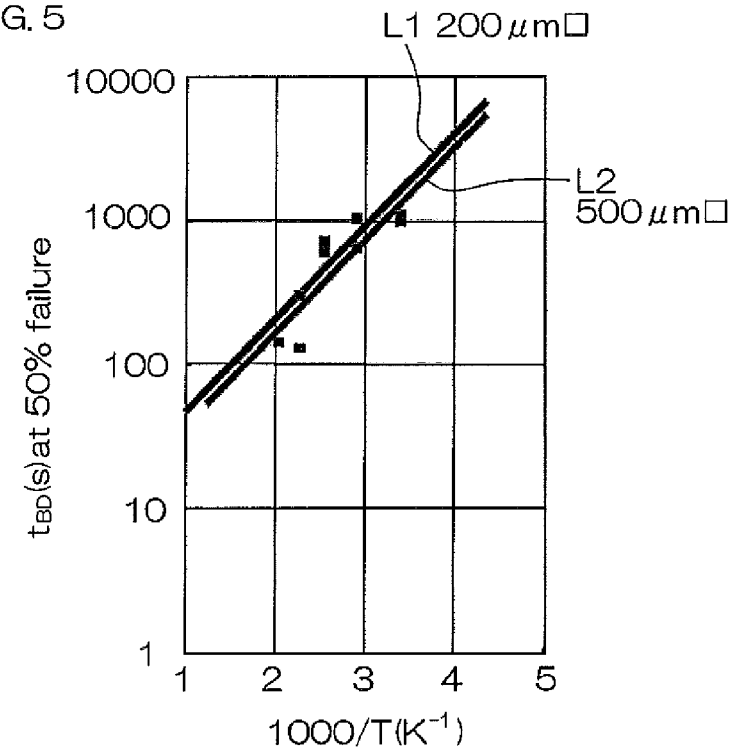
FIG. 5 shows results of TDDB tests (constant-voltage TDDB) conducted on thermally-oxidized films containing nitrogen.

FIG. 5 shows results of TDDB tests (constant-voltage TDDB) conducted on thermally-oxidized films containing nitrogen. The line L1 indicates test results for a thermally-oxidized film formed in a 200-μm square and the line L2 indicates test results for a thermally-oxidized film formed in a 500-μm square. The horizontal axis of FIG. 5 represents the sample temperature during each test, while the vertical axis of FIG. 5 represents the time to breakdown occurring in 50% of multiple samples. The larger the area of the thermally-oxidized film, the higher the possibility of having sites of poor film quality becomes, and the TDDB lifetime seems to be shortened.

For the reason above, in the gate insulating film 19, the third portion 193 in contact with each source region 15 preferably has an area smaller than that of the first and second portions 191 and 192. This results in a longer TDDB lifetime of the third portion 193, avoiding the third portion 193 putting a limitation on the reliability of the gate insulating film 19.

Figure 6:
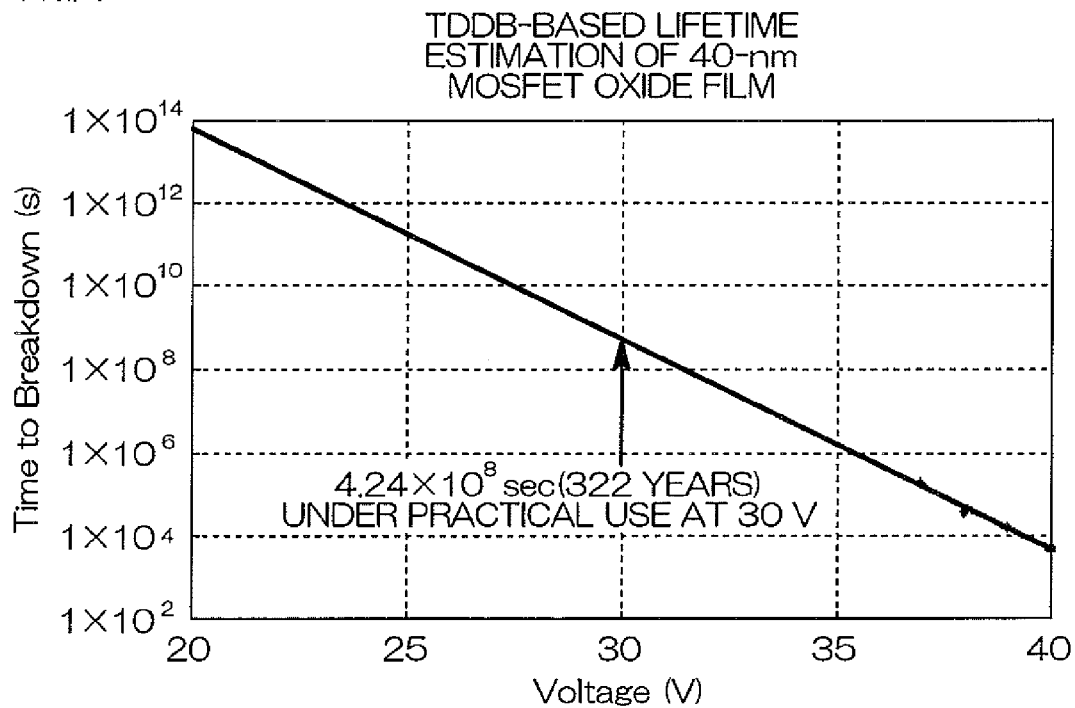
FIG. 6 shows an estimation result of TDDB lifetime (constant-voltage TDDB) for a thermally-oxidized film having a thickness of 40 nm (containing nitrogen atoms).

FIG. 6 shows an estimation result of TDDB lifetime (constant-voltage TDDB) for a thermally-oxidized film having a thickness of 40 nm (containing nitrogen atoms). The horizontal axis represents the voltage applied to the thermally-oxidized film, while the vertical axis represents the time to breakdown of the thermally-oxidized film. The line L3 is drawn based on results of measuring the TDDB lifetime when the applied voltage is 37 V, 38 V, and 39 V. For example, assuming that a voltage of 30 V is applied to the thermally-oxidized film under the practical environment of usage, the time to breakdown is $4.24 \times 10^8$ sec (322 years). Accordingly, in the case of guaranteeing a lifetime of 30 years as a product, the second portion of the gate insulating film 19 in contact with each body region 12 is only required to have a thickness of 4 nm or more. In the above-described embodiment, the thicknesses T1 and T2 of the first and second portions 191 and 192 of the gate insulating film 19 are, for example, 30 nm or more (preferably 40 nm or more), whereby the first and second portions 191 and 192 can ensure a voltage resistance of 30 V or higher and have a sufficient TDDB lifetime.

Figure 7:
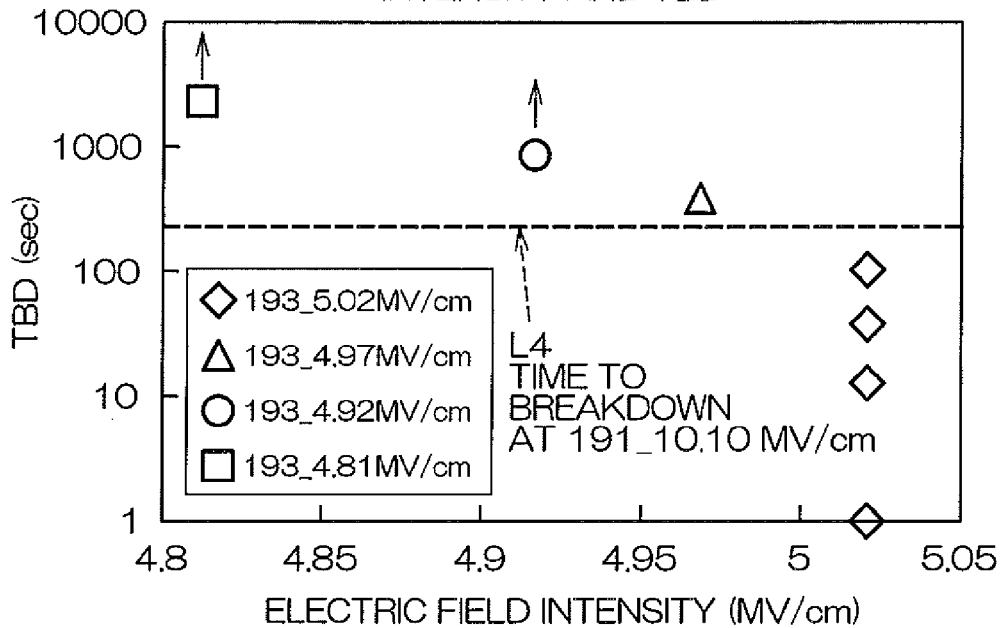
FIG. 7 shows results of TDDB tests (constant-voltage TDDB) conducted on samples having an insulating film equivalent to the first portion 191 of the gate insulating film 19 and an insulating film equivalent to the third portion 193 of the gate insulating film 19.

FIG. 7 shows results of TDDB tests (constant-voltage TDDB) conducted on the produced multiple samples having an insulating film equivalent to the first portion 191 of the gate insulating film 19 and an insulating film equivalent to the third portion 193 of the gate insulating film 19. When an electric field of 10.10 MV/cm was applied to the sample having an insulating film equivalent to the first portion 191, the time to breakdown was about 200 sec (indicated by the line L4). On the other hand, when an electric field of 5.02 MV/cm was applied to the sample having an insulating film equivalent to the third portion 193, the time to breakdown was shorter than 200 sec. From these results, if the gate insulating film 19 is produced such that the thickness T3 of the third portion 193 is equal to or smaller than 10.10/5.02=2.01 times the thickness T1 of the first portion 191, the third portion 193 will be subject to breakdown, if occurring in the gate insulating film 19. For example, if the first portion 191 has a thickness T1 of 100 nm and the third portion 193 has a thickness T3 of 200 nm and when the gate insulating film 19 is applied with a voltage of 101 V, the first portion 191 is applied with an electric field of 10.10 MV/cm, while the third portion 193 is applied with an electric field of 5.05 MV/cm, and therefore the third portion 193 will be subject to breakdown, if occurring in the gate insulating film.

On the other hand, when an electric field of 4.97 MV/cm was applied to the sample having an insulating film equivalent to the third portion 193, the time to breakdown was about 400 sec (note that the data measurements for the cases of 4.92 MV/cm and 4.81 MV/cm were cut short, and the time to breakdown is actually longer than plotted in the graph). From these results, if the gate insulating film 19 is produced such that the thickness T3 of the third portion 193 is equal to or greater than 10.10/4.97=2.03 times the thickness T1 of the first portion 191, it is possible to prevent or avoid the third portion 193 from being subject to breakdown, if occurring in the gate insulating film 19. That is, if the thickness T3 of the third portion 193 is equal to or greater than 2.03 times the thickness T1 of the first portion 191, the third portion 193, which has a lower reliability, cannot be subject to breakdown, whereby the gate insulating film 19 can ensure required reliability.

Figure 8:
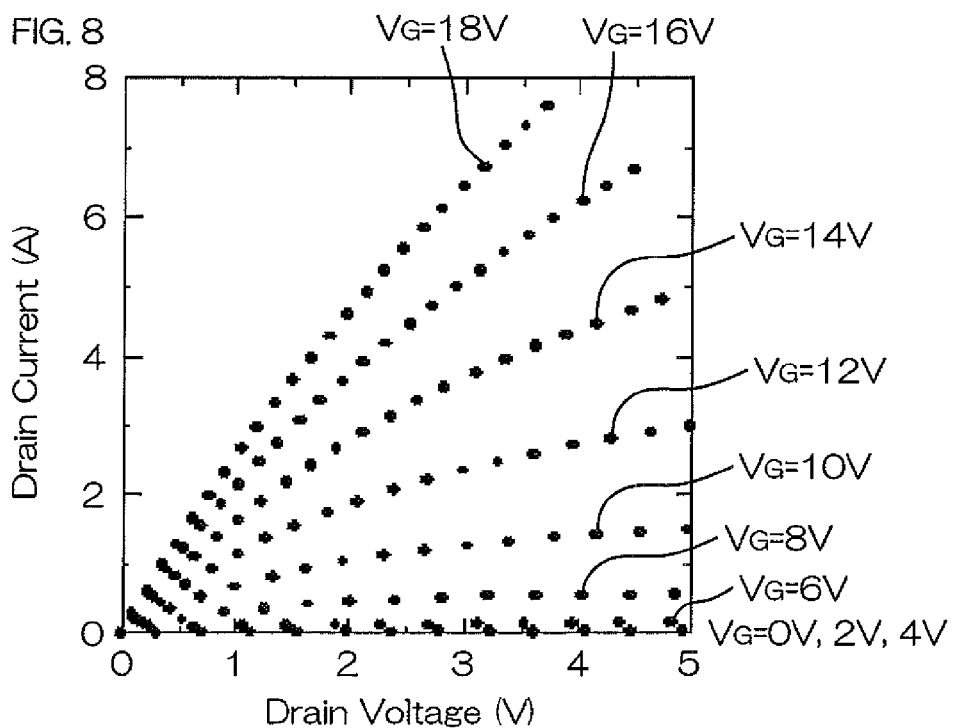
FIG. 8 shows the I-V characteristics of the semiconductor device.

FIG. 8 shows the I-V characteristics of the semiconductor device 1. The horizontal axis represents the drain voltage, while the vertical axis represents the drain current. The drain voltage/drain current characteristics are shown at a gate voltage $V_G$ of 0 to 18 V. It is found from FIG. 8 that when the gate voltage $V_G$ is 6 V or higher, a channel is formed and the drain current shows a significant value.

FIG. 9 shows a relationship between the channel length L and the DS yield (off-characteristics). The DS yield means a ratio of products that undergo a source-drain off-state (cut-off state) when the gate voltage $V_G$ is lower than a threshold value (e.g., 6 V). FIG. 9 shows relative values, given that the yield at the channel length L=0.45 μm is 1. It is found from FIG. 9 that the DS yield is saturated at the channel length L=0.65 μm. That is, the channel length L of 0.65 μm or more allows the semiconductor device 1 to be produced in good yield.

Next will be described the relationship between the impurity concentration in the SiC epitaxial layer and the thickness of the thermally-oxidized film formed on the surface of the epitaxial layer. Multiple test samples including 9 mm×12 mm rectangular ones and fan-shaped ones having a radius of 18 mm or less were used to conduct an experiment.

Each sample underwent the following process flow. First, the sample substrate with an SiC epitaxial layer formed thereon was rinsed, and then phosphorus (P) ions were implanted into the SiC epitaxial layer as n type impurity ions. Next, the implanted phosphorus ions were activated through heat treatment (annealing), and then thermal oxidation was applied (in an oxidation gas atmosphere containing N). The thickness of the thermally-oxidized film formed on the surface of the SiC epitaxial layer was then measured.

The implantation of phosphorus ions was carried out while the epitaxial layer was kept at a temperature of 150° C. or lower (specifically at room temperature) under the first, second, or third condition shown in Table 1 below.

TABLE 1

| | Condition 1 | Condition 2 | Condition 3 |
|---|---|---|---|
| Impurity concentration ($cm^{-3}$) | $1.00 \times 10^{19}$ | $1.00 \times 10^{18}$ | $1.00 \times 10^{17}$ |

That is, under the first condition, the surficial portion of the SiC epitaxial layer contained n type impurities at a concentration of $1 \times 10^{19}$ $cm^{-3}$. Also, under the second condition, the surficial portion of the SiC epitaxial layer contained n type impurities at a concentration of $1 \times 10^{18}$ $cm^{-3}$. Further, under the third condition, the surficial portion of the SiC epitaxial layer contained n type impurities at a concentration of $1 \times 10^{17}$ $cm^{-3}$.

Table 2 below shows results of measuring the film thickness (median values of the measured thickness for multiple samples). That is, the thickness was 426 nm under the first condition, 403 nm under the second condition, and 407 nm under the third condition. It is found from these results that the higher the n type impurity concentration, the more the thermally-oxidized film is likely to be thickened (the higher the oxidation rate becomes), and that if the n type impurity concentration is at least $1 \times 10^{19}$ $cm^{-3}$, an increase in the oxidation rate is observed clearly.

TABLE 2

| | Experimental results | | |
|---|---|---|---|
| | Condition 1 | Condition 2 | Condition 3 |
| Impurity concentration ($cm^{-3}$) | $1.00 \times 10^{19}$ | $1.00 \times 10^{18}$ | $1.00 \times 10^{17}$ |
| Film thickness (Median) | 426 | 403 | 407 |

As a result, in the semiconductor device 1, each source region 15 preferably has an n type impurity concentration of $1 \times 10^{19}$ $cm^{-3}$ or higher, whereby the thickness T3 of the third portion 191 of the gate insulating film 19 in contact with each source region 15 can be increased selectively. Also, each source region 15 preferably has an n type impurity concentration of $1 \times 10^{23}$ $cm^{-3}$ or lower, at which there is an activation limit.

It is noted that in the semiconductor device 1, since the surface 9 of the epitaxial layer 8 is formed of a silicon plane having an off-angle of 0 to 10 degrees (preferably 0 to 5 degrees), the gate insulating film 19 can be thickened easily during formation through thermal oxidation. This allows the third portion 193 in contact with each source region 15 to be thickened easily to ensure a required thickness.

Although the embodiment of the present invention has heretofore been described, the present invention can be embodied in still other forms. For example, the above-described embodiment exemplifies the case of using SiC, one example of compound semiconductors, as a semiconductor material. However, Si may be used as a semiconductor material, or another compound semiconductor such as GaN may be used.

The above-described embodiment also exemplifies arranging body regions 12 in a matrix, which is illustrative only. For example, the body regions 12 may be arranged in a staggered pattern. The body regions 12 may also have an elongated (e.g., strip-like) planar shape.

Further, the conductive type of each semiconductor portion in the semiconductor device 1 may be inverted to form a p-channel type transistor. That is, in the semiconductor device 1, the p type portions may be inverted into n type, while the n type portions may be inverted into p type.

The semiconductor device according to the present invention can be incorporated in, for example, a power module used for an inverter circuit that constitutes a drive circuit for driving an electric motor used as a power source for electric vehicles (including hybrid electric vehicles), trains, industrial robots, and the like. The semiconductor device can also be incorporated in a power module used for an inverter circuit for converting electric power generated by photovoltaic cells, wind generators, and other power generating equipment (particularly private power generators) to match commercially supplied electric power.

Although the embodiments of the present invention have heretofore been described in detail, these are merely specific examples used to clarify the technical contents of the present invention, and the present invention should not be understood as being limited to these examples, and the scope of the present invention is to be determined solely by the appended claims.

The present application corresponds to Japanese Patent Application No. 2010-209627 filed in the Japan Patent Office on Sep. 17, 2010, and the entire disclosure of the application is incorporated herein by reference.

REFERENCE SIGNS LIST

1 Semiconductor device
2 Source pad
3 Removal region
4 Gate pad
5 SiC substrate
6 Surface (Si plane) of the SiC substrate
7 Back surface (C plane) of the SiC substrate
8 Epitaxial layer
9 Surface of the epitaxial layer
10 Active region
11 Guard ring
12 Body region
13 Drift region
14 Body contact region
15 Source region
19 Gate insulating film
191 First portion: thickness T1
192 Second portion: thickness T2
193 Third portion: thickness T3

20 Gate electrode
25 Interlayer insulating film
26 Contact hole
27 Source electrode
28 Ti/TiN layer
29 Al layer
30 Drain electrode
31 $SiO_2$ mask
32 $SiO_2$ mask
33 $SiO_2$ mask
34 $SiO_2$ mask
35 Polysilicon material
L Channel length

The invention claimed is:

1. A semiconductor device comprising:
   a first conductive-type semiconductor layer;
   a second conductive-type body region formed in an upper portion of the semiconductor layer;
   a first conductive-type source region formed in an upper portion of the body region;
   a gate insulating film provided on the semiconductor layer and containing nitrogen atoms, the gate insulating film including a first portion in contact with the semiconductor layer outside the body region, a second portion in contact with the body region, and a third portion in contact with the source region; and
   a gate electrode provided on the gate insulating film in an area extending over the semiconductor layer outside the body region, the body region, and the source region, the gate electrode having an edge recessed from an edge of the gate insulating film and positioned above the source region such that the gate electrode has an overlapping portion opposing the source region with the third portion of the gate insulating film interposed therebetween;
   an insulating film formed on the gate electrode such that the insulating film covers an upper surface and the edge of the gate electrode and reaches the gate insulating film to be in contact with an upper surface of the gate insulating film between the edge of the gate insulating film and the edge of the gate electrode,
   wherein the third portion of the gate insulating film has a thickness greater than a thickness of the first portion and greater than a thickness of the second portion, such that a lower surface of the third portion is disposed at a position that is lower than a lower surface of the first portion and a lower surface of the second portion, and such that the upper surface of the third portion is disposed at a position that is higher than the upper surface of the first portion and the upper surface of the second portion.

2. The semiconductor device according to claim 1, wherein the thickness of the third portion of the gate insulating film is not less than 2.03 times the thickness of the first portion.

3. The semiconductor device according to claim 1, wherein the thickness of the second portion of the gate insulating film is equal to or greater than 30 nm.

4. The semiconductor device according to claim 1, wherein the source region contains first conductive-type impurities at a concentration of $1\times10^{19}$ $cm^{-3}$ or higher.

5. The semiconductor device according to claim 1, further comprising an SiC substrate that has a silicon plane having an off-angle of 0 to 10 degrees, wherein the semiconductor layer is formed on the silicon plane of the SiC substrate.

6. The semiconductor device according to claim 1, wherein the third portion of the gate insulating film has an area smaller than an area of the first portion and an area of the second portion.

7. The semiconductor device according to claim 1, wherein the body region contains second conductive-type impurities at a surface in contact with the gate insulating film at a concentration of $1\times10^{17}$ $cm^{-3}$ or lower.

8. The semiconductor device according to claim 1, wherein the overlapping portion of the gate electrode protrudes into the source region by 0.2 to 1 μm from the boundary between the body region and the source region.

9. The semiconductor device according to claim 1, having a channel length of 0.65 μm or more.

10. The semiconductor device according to claim 1, wherein the gate electrode is applied with a voltage of 6 V or higher.

11. The semiconductor device according to claim 1, wherein the gate electrode comprises polysilicon.

12. The semiconductor device according to claim 1, wherein the semiconductor layer is made of SiC.

13. The semiconductor device according to claim 1, further comprising a body contact region formed in an upper portion of the body region and protruding upward with respect to an upper surface of the source region.

14. The semiconductor device according to claim 1, further comprising a laminated film including an adhesive layer and a barrier layer, the adhesive layer being in contact with the source region, and wherein an interface between the adhesive layer and the source region is flush with the lower surface of the third portion of the gate insulating film.

15. A semiconductor device comprising:
    a first conductive-type semiconductor layer;
    a second conductive-type body region formed in an upper portion of the semiconductor layer;
    a first conductive-type source region formed in an upper portion of the body region;
    a gate insulating film provided on the semiconductor layer and having a predetermined width, the gate insulating film including a first portion in contact with the semiconductor layer outside the body region, a second portion in contact with the body region, and a third portion in contact with the source region; and
    a gate electrode provided on the gate insulating film in an area extending over the semiconductor layer outside the body region, the body region, and the source region, the gate electrode having a width that is smaller than the width of the gate insulating film so that a peripheral edge of the gate electrode is recessed from an adjacent edge of the gate insulating film,
    wherein the third portion of the gate insulating film has a thickness greater than a thickness of the first portion and greater than a thickness of the second portion, such that a lower surface of the third portion is disposed at a position that is lower than a lower surface of the first portion and a lower surface of the second portion, and such that an upper surface of the third portion is disposed at a position that is higher than an upper surface of the first portion and an upper surface of the second portion, and
    wherein the gate insulating film contains nitrogen atoms, including nitrogen atoms under a central portion of the gate electrode.

16. The semiconductor device according to claim 15, further comprising a laminated film including an adhesive layer and a barrier layer, the adhesive layer being in contact with the source region, and wherein an interface between the adhesive layer and the source region is flush with the lower surface of the third portion of the gate insulating film.

* * * * *